(12) United States Patent
Schmidt et al.

(10) Patent No.: US 9,937,584 B2
(45) Date of Patent: Apr. 10, 2018

(54) ELECTRON-BEAM-SUPPORTED PRODUCTION OF ELECTRICAL COMPONENTS

(71) Applicant: Tyco Electronics AMP GmbH, Bensheim (DE)

(72) Inventors: Helge Schmidt, Speyer (DE); Eva Henschel, Duisburg (DE); Soenke Sachs, Frankfurt am Main (DE)

(73) Assignee: TE Connectivity Germany GmbH, Bensheim (DE)

( * ) Notice: Subject to any disclaimer, the term of this patent is extended or adjusted under 35 U.S.C. 154(b) by 348 days.

(21) Appl. No.: 14/470,190

(22) Filed: Aug. 27, 2014

(65) Prior Publication Data
US 2015/0060416 A1 Mar. 5, 2015

(30) Foreign Application Priority Data

Aug. 27, 2013 (DE) .................. 10 2013 217 068

(51) Int. Cl.
| | |
|---|---|
| *B23K 15/00* | (2006.01) |
| *B23K 15/08* | (2006.01) |
| *H01J 37/305* | (2006.01) |
| *H01R 43/16* | (2006.01) |
| *B23K 15/06* | (2006.01) |
| *B23K 101/34* | (2006.01) |
| *B23K 101/38* | (2006.01) |
| *B23K 103/12* | (2006.01) |

(52) U.S. Cl.
CPC ........ *B23K 15/0006* (2013.01); *B23K 15/002* (2013.01); *B23K 15/0033* (2013.01); *B23K 15/06* (2013.01); *B23K 15/08* (2013.01); *H01J 37/305* (2013.01); *H01R 43/16* (2013.01); *B23K 2201/34* (2013.01); *B23K 2201/38* (2013.01); *B23K 2203/12* (2013.01); *H01J 2237/31* (2013.01)

(58) Field of Classification Search
CPC ..... B23K 15/00; B23K 15/0006; B23K 15/08
See application file for complete search history.

(56) References Cited

U.S. PATENT DOCUMENTS

| | | | | |
|---|---|---|---|---|
| 4,470,945 A | * | 9/1984 | Howard | B05D 7/14 |
| | | | | 264/259 |
| 4,510,371 A | * | 4/1985 | Nakamura | B23K 15/00 |
| | | | | 219/121.35 |
| 4,670,636 A | * | 6/1987 | Taub | B23K 15/08 |
| | | | | 219/121.18 |
| 2014/0097003 A1 | * | 4/2014 | Sachs | B23K 15/0006 |
| | | | | 174/250 |

FOREIGN PATENT DOCUMENTS

DE   102011006899 A1 * 10/2012 ............. H01R 13/03

* cited by examiner

*Primary Examiner* — Ryan A Reis
(74) *Attorney, Agent, or Firm* — Barley Snyder

(57) ABSTRACT

A method for producing an electrical component is provided. The method includes steps of providing a continuous strip material and separating a section from the continuous strip material using an electron beam.

19 Claims, 9 Drawing Sheets

ELECTRON-BEAM-SUPPORTED PRODUCTION OF ELECTRICAL COMPONENTS

CROSS-REFERENCE TO RELATED APPLICATIONS

This application claims the benefit of the filing date under 35 U.S.C. § 119(a)-(d) of German Patent Application no. DE 10 2013 217 068.8, filed on Aug. 27, 2013.

FIELD OF THE INVENTION

The invention relates to a method for producing an electrical component and, more particularly, a method for producing a contact element for a plug connector

BACKGROUND

Manufacturing electrical components, such as, for example, a contact element for a plug connector, is often complex, cost-intensive, and inflexible since a separate tool is generally required for each layout.

SUMMARY

An object of the invention, among others, is to provide a method for producing at least one electrical component, in particular a contact element, which is more flexible, more versatile and more cost-effective than conventional methods.

Accordingly, a method for producing the electrical component is provided. The method includes steps of providing a continuous strip material and separating a section from the continuous strip material using an electron beam.

BRIEF DESCRIPTION OF THE DRAWINGS

The invention will be described in greater detail with reference to exemplary embodiments shown in the accompanying drawings, in which.

DETAILED DESCRIPTION OF THE EMBODIMENT(S)

Exemplary embodiments of the invention will now be described with reference to Figures.

Figure 1:
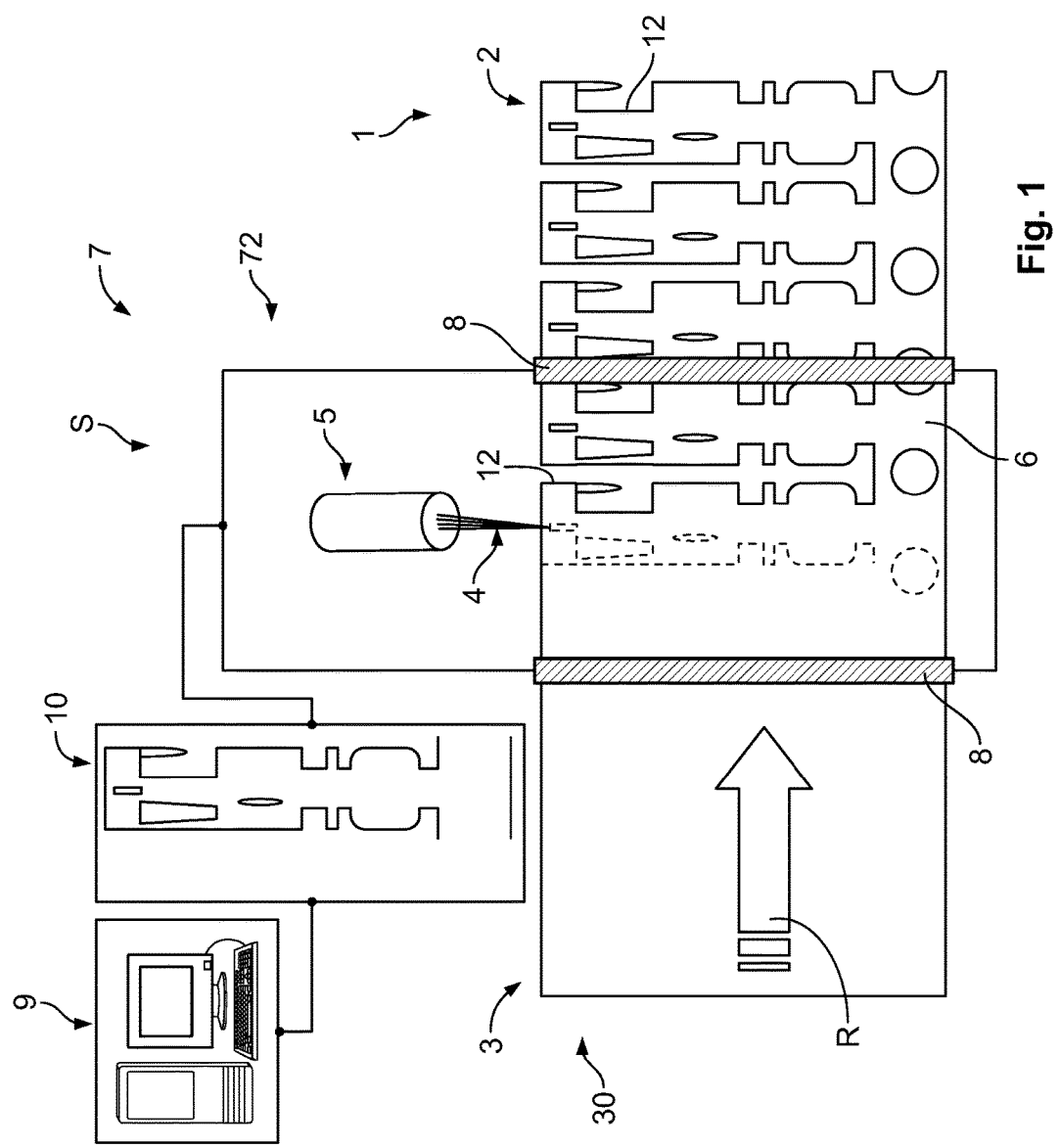
FIG. 1 is a block diagram of a method for producing an electrical component according to the invention.

With reference to FIG. 1, a method V according to the invention for producing an electrical component 1 is disclosed, and includes a cutting step S. In the shown embodiment, the electrical component is a contact element 2.

In one step, contact elements 2 are at least partially separated from a carrier 30 and, in particular, cut into or from the carrier 30. Before the cutting step S is carried out, a strip material 3, which becomes the carrier 30, is still continuous and has no cuts along an inner side. During the cutting step S, a large number of contact elements 2 are at least partially cut from the continuous strip material 3 or separated therefrom using an electron beam 4.

The electron beam 4 originates from an electron beam source 5 and may include additional elements beyond the electron source, including acceleration elements, focusing elements and redirection elements (not shown).

The electron beam 4 can be used to cut the outer contours. However, the electron beam 4 can also be used to cut closed holes along the inner side that are not accessible from the outer sides. Since the electron beam can be redirected very rapidly, high cutting speeds of up to 4000 mm/s or more are possible. In this instance, the position of the electron beam can be adjusted precisely to within a few μm. For instance, the beam may have a diameter of less than 100 μm. A typical output power of an electron beam is from 50 to 5000 Watts. The electrons may accelerate with an acceleration voltage of from 20 to 150 kV. Depending on the installation and application purpose, the values mentioned may be increased or decreased.

In the method V shown, the strip material 3 may move at a continuous speed or gradually. In this instance, an adaptation of the redirection of the electron beam 4 to the travel speed of the strip material 3 at which it travels in the displacement direction R may then be required.

When the cutting step S is carried out, the strip material 3 is in a vacuum 6. This is a high vacuum, in which there is a pressure <$10^{-3}$ mbar. Outside the region of the vacuum 6, there is normal pressure. In order to be able to move the strip material from normal pressure into the vacuum and then back to normal pressure, the device 7 includes high vacuum cascade arrangements 8 (schematically shown) that enable the pressure to be reduced and increased again at different stages of manufacturing.

FIG. 1 further discloses a control system having a computer 9 that instructs a cutting module 72 to out a pattern 10. This pattern 10 is subsequently cut from the strip material 3.

The strip material may, for example, be a metal sheet. The strip material may already be coated, for example, using a metal-plating process.

After the cutting step is performed (as shown in FIG. 1), further process steps may be carried out. For example, a contact element 2 may be definitively separated from the carrier 30 in another step. This may be carried out, for example, using breaking, punching or cutting. However, since the contact element 2 is carried through the process before being connected, for example, to a cable, the contact element 2 is still located on the carrier 30, even after the cutting step S, in order to enable simple storage and simple transport.

The electron beam 4 may round the edges 12 of the contact element 2 along the cutting region. This may be automatically carried out when the material is melted and/or in a selective manner by controlling the electron beam 4 to round the edges 12. As a result, the edges 12 may lead to less damage than non-rounded edges 12.

By use of the electron beam 4, the electrical component 1 can be chemically and/or physically changed, at least in the edge region and/or cutting region. For example, the material at this location can be oxidised or reduced. A change of the hardness and/or the grain structure may be affected in the cutting region. Regions, which have been processed with the electron beam, may have different chemical and/or physical properties from regions that have not been processed.

Figure 2:
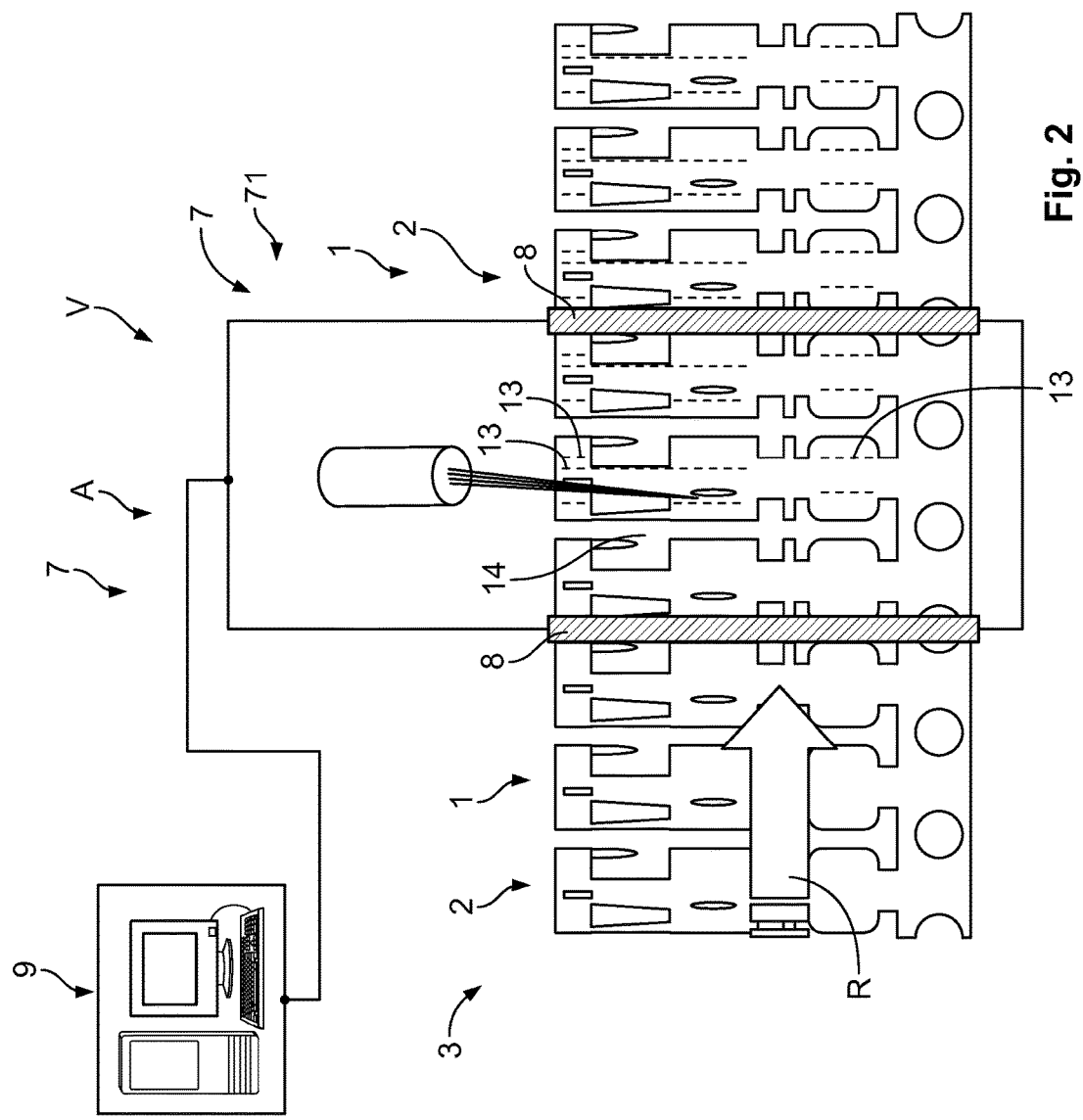
FIG. 2 is a block diagram of another method for producing an electrical component according to the invention.

Now with reference to FIG. 2, the method V according to the invention includes a softening step A, in which crease portions 13 of the electrical component 1 are softened in a selective manner using the electron beam 4. To this effect, the device 7 has a softening module 71. The crease portions 13 are linear portions. After the softening step A, the contact elements 2 can be more readily folded and/or bent along the crease portions 13. In a similar manner to the method in FIG. 1, other method steps can be carried out before and after the method step shown in FIG. 2. For example, the shown strip material 3 has already been partially cut into contact elements 2 before it is softened at the crease portions 13.

In order to control the electron beam 4, a computer 9 is used. Furthermore, the device 7 has high-pressure reduction cascade arrangements 8 that isolate the processing region 14 from the environment in terms of pressure. Since the strip material 3 passes through the processing region 14, slots are provided in the high-pressure reduction cascade arrangements 8 through which the strip material 3 travels.

Figure 3:
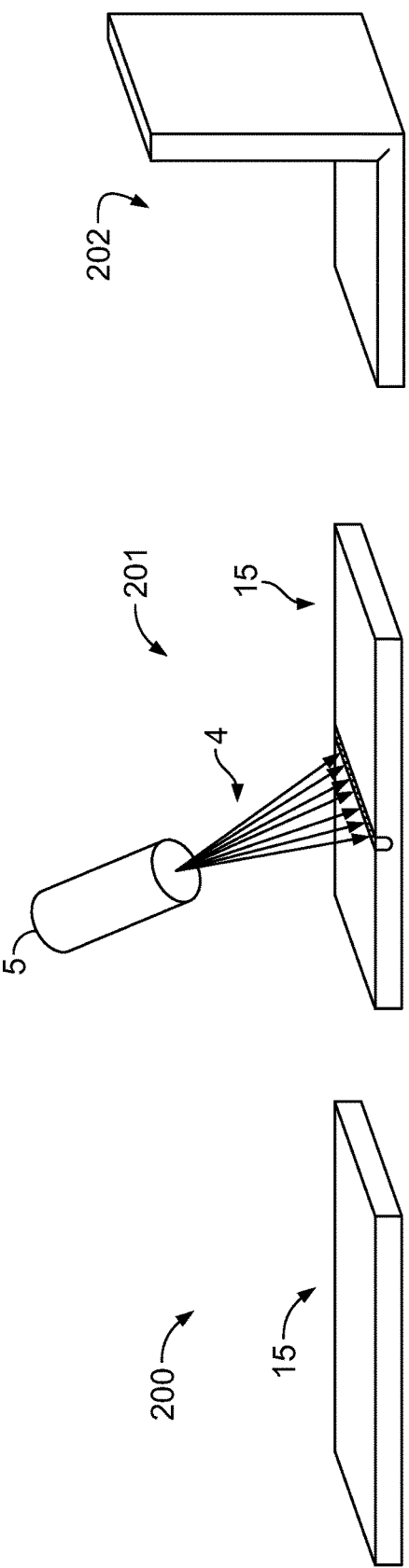
FIG. 3 is perspective diagrammatic view of the method from FIG. 2.

As shown in FIG. 3, during method step 200, the material 15 to be processed is still unprocessed. During method step 201, the material 15 is processed using the electron beam 4. In this instance, a point-like electron beam 4 is moved over the sample or a linear electron beam 4 can be used. The electron beam 4 has a comparatively low intensity and a long reaction time. Heat is thereby discharged into adjacent regions of the linear region. After the electron beam 4 has been turned off, the linear region therefore slowly cools. The material structure may in this region become close to a state of equilibrium. In such a state, comparatively few grain boundaries are present. The material 15 is thereby soft at this location. At method step 202, the material 15 can therefore be bent along the linear region that has been softened.

Figure 4:
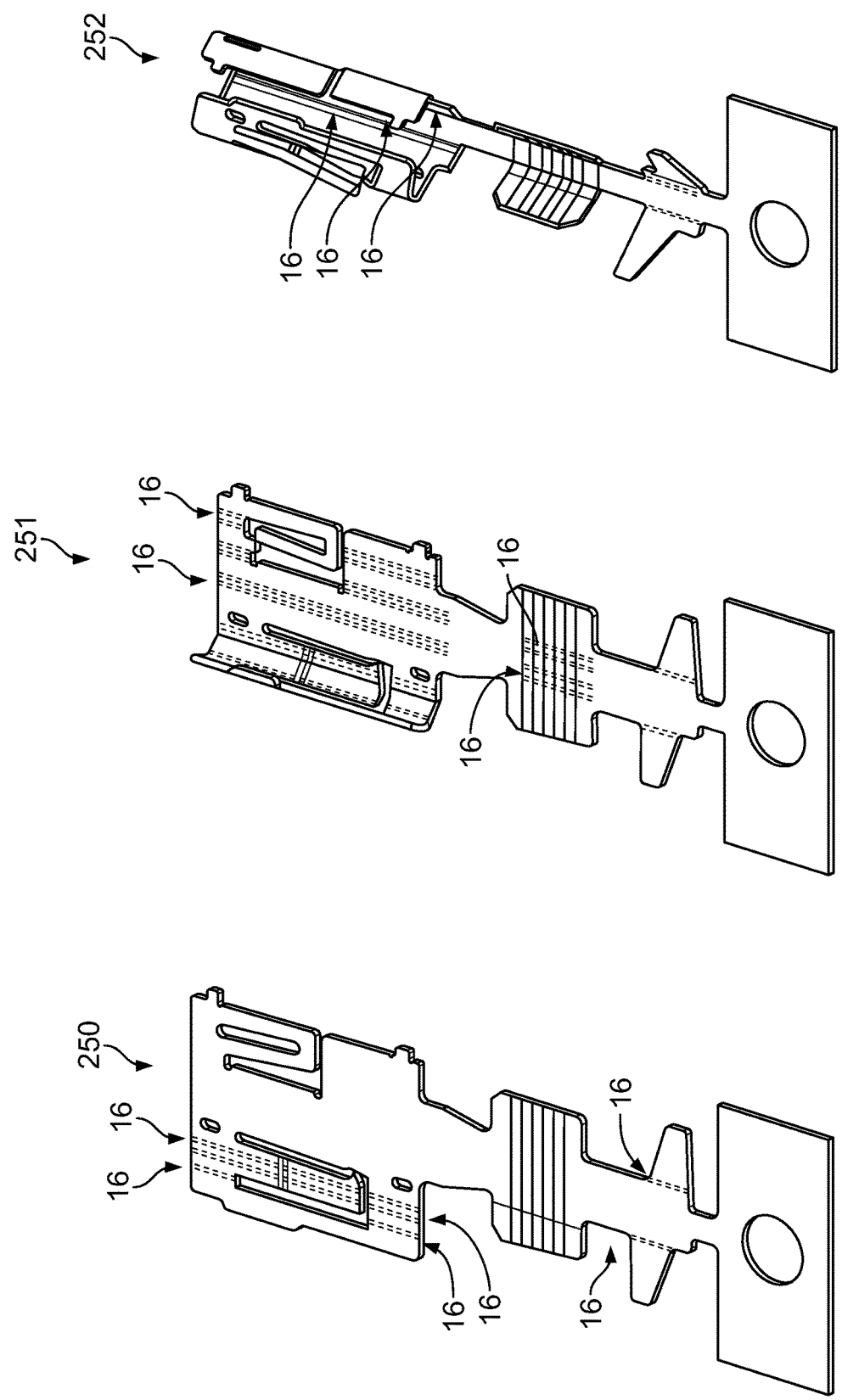
FIG. 4 is a perspective progression view of an electrical contact being manufactured using the method according to FIG. 2.

Now with reference to FIG. 4, a contact element 2 is produced using the method steps shown in FIGS. 2 and 3. At step 250, the contact element 2 includes fold edges 16 that have been softened by the method V. At step 251, the fold edges 16 are bent. Furthermore, additional fold edges 16 are produced by an electron beam 4 that is moved over the contact element 2 at other locations. During step 252, the additional fold edges 16 are bent. All the fold edges 16 may be softened before they are bent in one or more subsequent steps.

Figure 5:
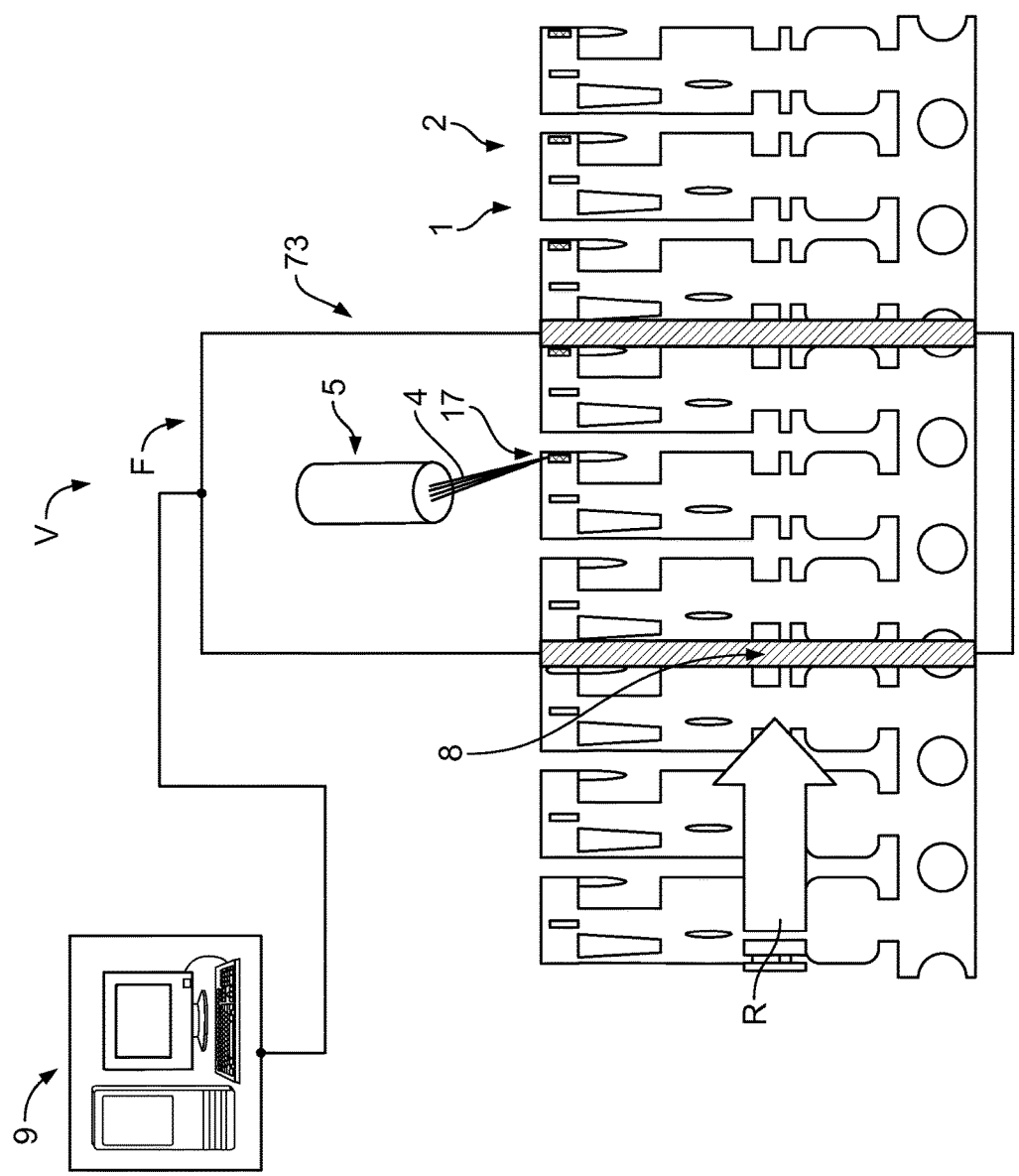
FIG. 5 is a block diagram of another method for producing an electrical component according to the invention.

Now with reference to FIG. 5, the method V according to the invention is disclosed, and includes a hardening step F. The electron beam 4 is used to harden an impact portion 17 through a hardening module 73. The impact portion 17 may, for example, be a portion that is subjected to the impact of engagement operations when the contact element 2 is used. The hardening step F can also be used to increase the resilient force in a region of the impact portion 17. This may, for instance, be relevant if particularly small contact elements 2 are produced. Connection for a small contact may be more difficult therein since the material does not have a very high degree of resiliency resulting from its thin construction. The hardening step F increases the resilient force of the contact element 2, and thereby better connection can be ensured. In another embodiment, the hardening step F can be carried out after the softening step A, described above. For example, the crease portion 13 may be hardened after softening and bending, for example, after the contact element 2 has been bent along the crease portion 13.

Figure 6:
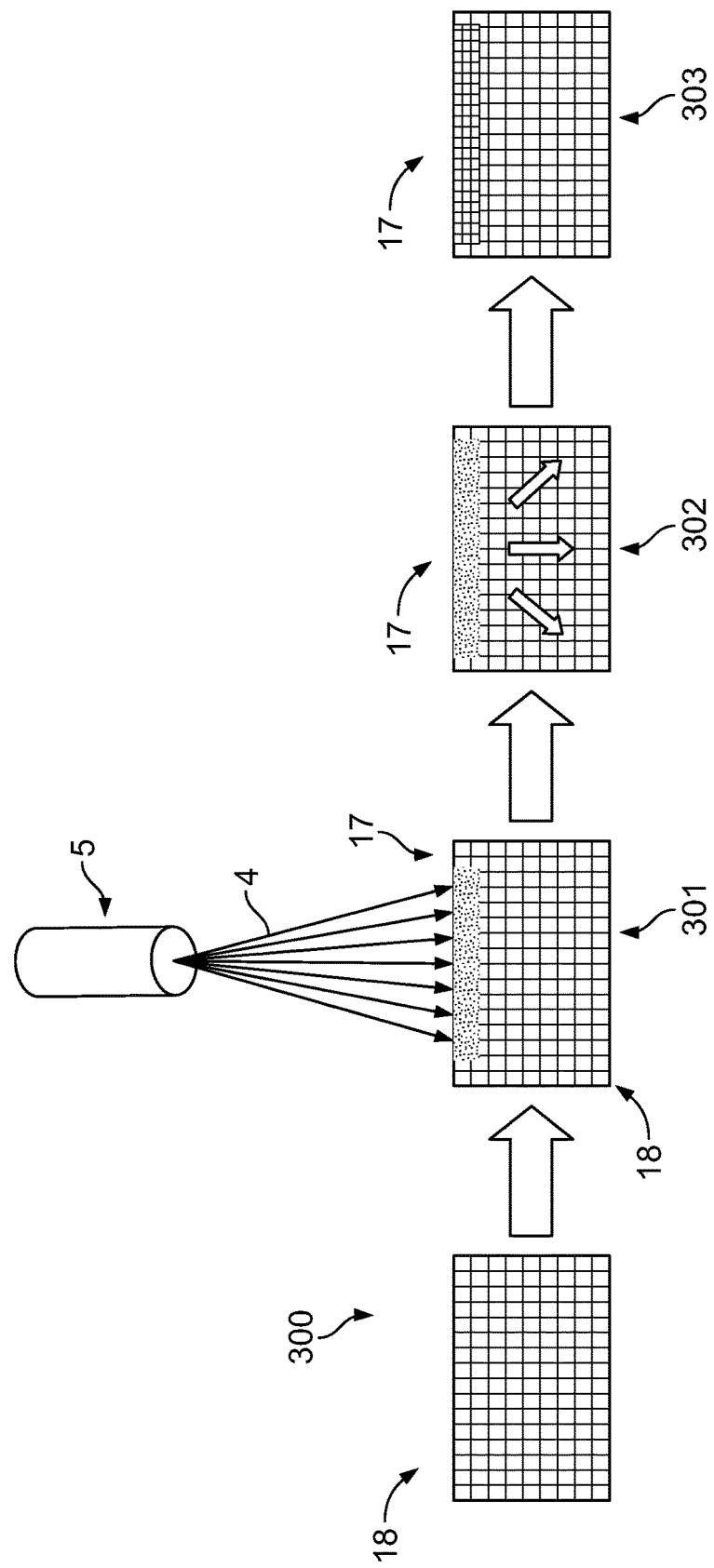
FIG. 6 is another block diagram of the method from FIG. 5.

As shown in FIG. 6, during step 300 of the hardening step F, the material 18 to be processed is still unprocessed. During step 301, an impact portion 17 of the material 18 is processed using an electron beam 4. The electron beam 4 is in this instance is very intensive and the reaction time is very short. The impact portion 17 is thereby heated very rapidly, but the surrounding regions are hardly heated at all. In the third method step 302, the heat produced in the impact portion 17 is rapidly dissipated to the adjacent regions because of the high temperature gradient. The impact portion 17 therefore cools very significantly and very rapidly. As a result, the material cannot change into a state of equilibrium along the impact portion 17, hut instead is frozen in a relatively unstructured state. It has many grain boundaries in this region. The material in the impact portion 17 is therefore very hard.

Figure 7:
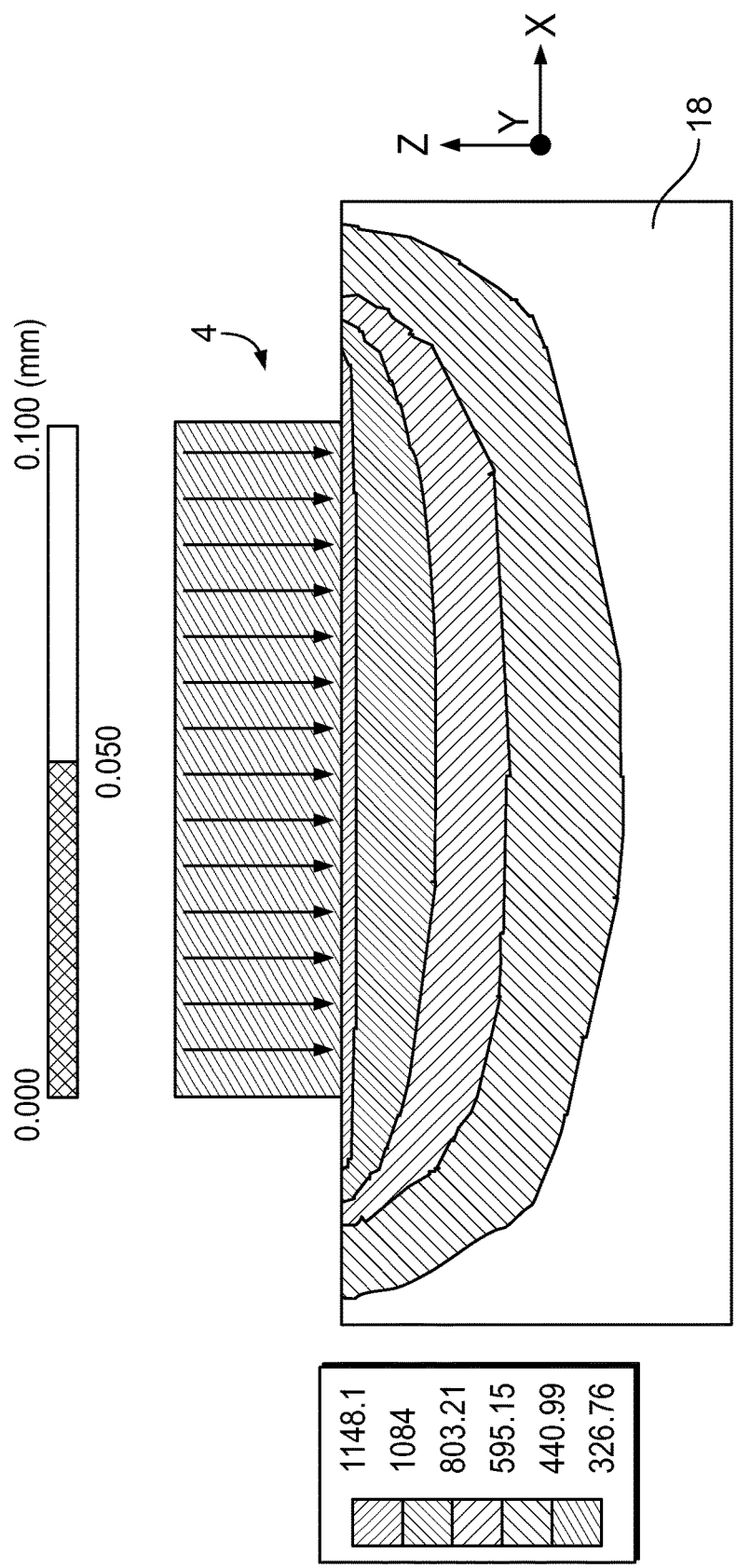
FIG. 7 is a sectional view showing heat distribution during the method according to FIG. 5.

Now with reference to FIG. 7, heat distribution across the material 18 resulting from the electron beam 4 is illustrated. In the exemplary embodiment, the material is a copper alloy. The electron beam 4 has a beam diameter of 100 µm, an electron beam energy of 175 W, which results in a reaction time of 12 µs. As a result, the material 18 is melted directly along the surface. In the adjacent region, temperatures are approximately 1100° C. Since the electron beam 4 is very intensive and short, temperatures are only approximately 300° C. only a short distance of 10 µm away. The heat transfer is therefore carried out in a very local and concentrated manner. It is ensured that the heat, which is produced from the high temperature gradient, can be rapidly discharged to the surrounding regions and the irradiated region is very rapidly cooled. The rather disorderly grain structure resulting from the high temperature is therefore frozen and the material has many grain boundaries at that location. It is thereby very hard and stable.

Figure 8:
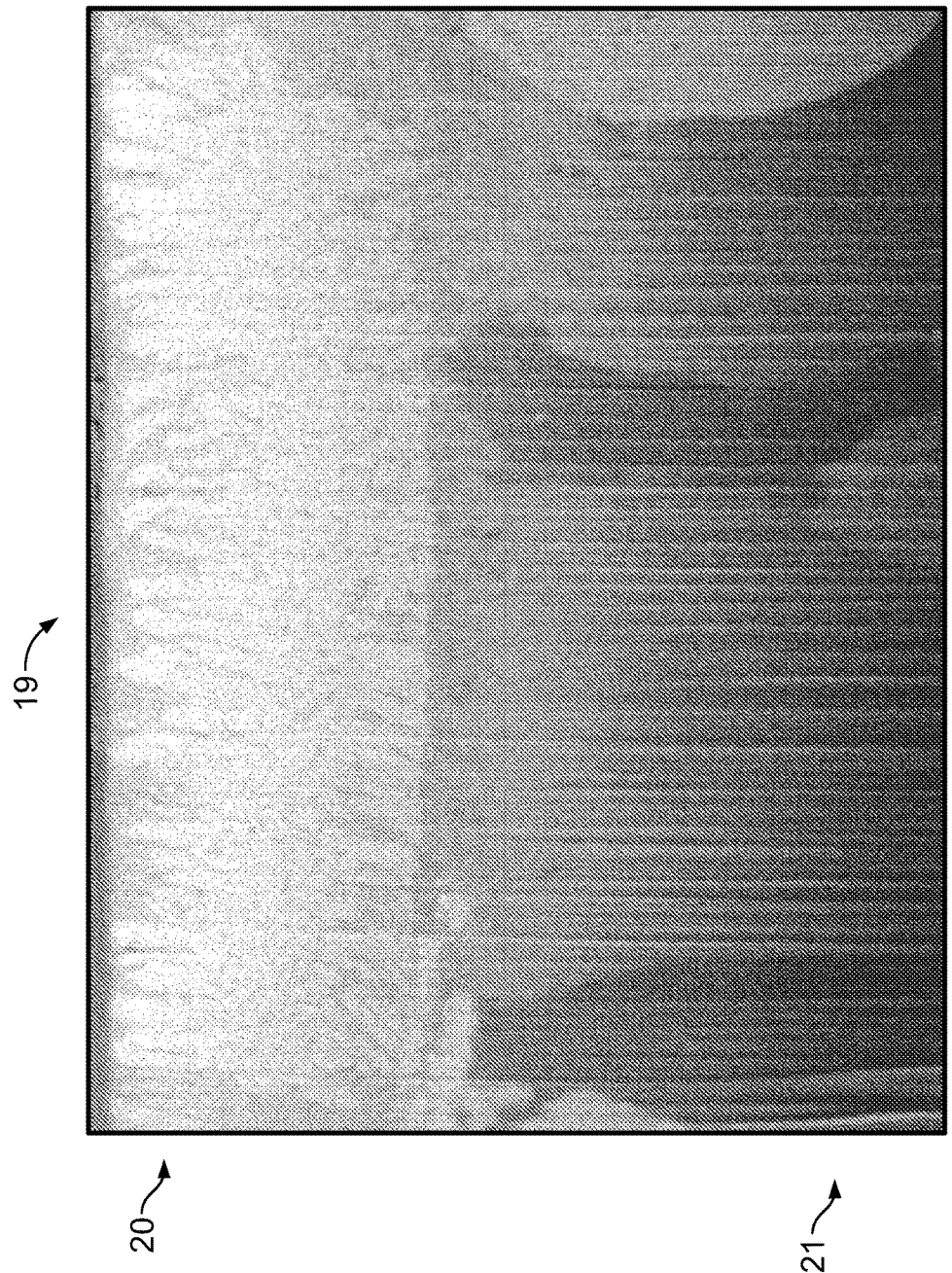
FIG. 8 is a scanning electron microscope image of material processed using the method according to FIG. 5.

FIG. 8 shows a section of the material that has been processed using electron beam 4, through a focused ion beam (FIB). The picture is an image from a scanning electron microscope. In the upper region 20 which is adjacent to a surface 19, the material has an increased number of grain boundaries. In the lower region 21, which has not been heated so significantly, however, there are fewer grain boundaries. The upper region 20 is therefore harder compared with the lower region 21.

Figure 9:
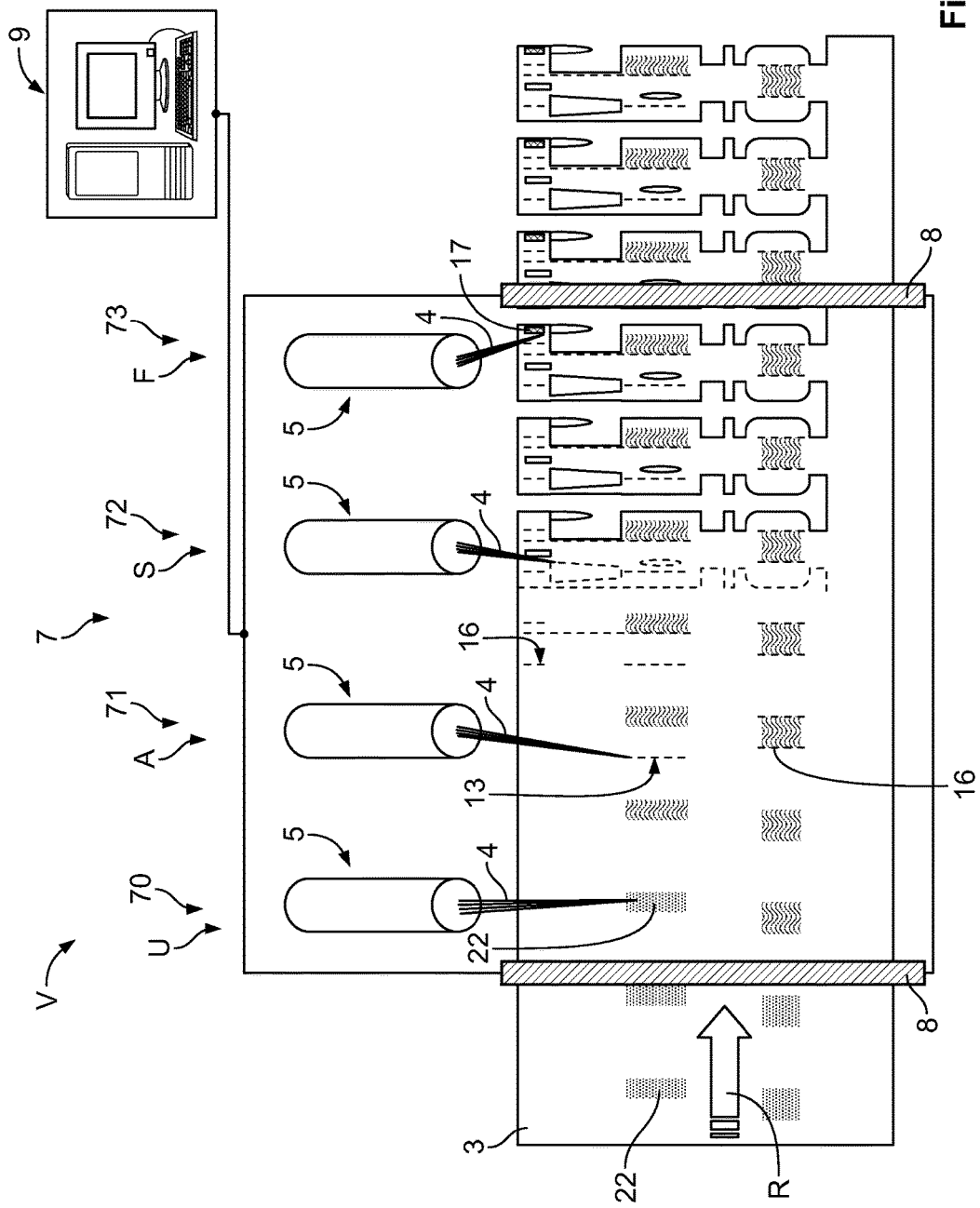
FIG. 9 is a block diagram of another method for producing an electrical component according to the invention.

Now with reference to FIG. 9, the method V according to the invention is disclosed, and includes a remelting step U. During the remelting step U, material that has been applied to the strip material 3 in the form of a metal dye 22 is melted. Alternatively, another material can also be applied to the strip material 3 for remelting. This may, for example, be sprayed on or applied as a powder.

In the subsequent softening step A, the crease portions 13 are softened and fold edges 16 are thereby produced. During the cutting step S, the contours and inner regions, which are intended to be freestanding, are cut with the electron beam 4. Afterwards, other impact portions 17 are hardened with the electron beam 4 in the hardening step F. In these four method steps, four different electron beam sources 5 are used in order to achieve higher levels of productivity. In an alternative embodiment, it is also possible to use only a single electron beam source 5 for all the method steps U, A, S, F. Since the electron beam can be controlled and redirected very easily and very rapidly with electrical and/or magnetic fields, no significant pauses are required between the individual method steps.

In the method V shown in FIG. 9, the strip material 3 can be moved continuously in the movement direction R. The electron beams 4 move with the strip material. The movement of the electron beams 4 and also the other parameters and the cutting patterns are again calculated and controlled by the computer 9.

The device 7 shown includes a remelting module 70, a softening module 71, a cutting module 72 and a hardening module 73. In particular, the softening module 71 is constructed for softening using an electron beam 4. Furthermore, the cutting module 72 is constructed for cutting using an electron beam 4. The hardening module 73 is also constructed for hardening using an electron beam 4. Finally, the remelting module 70 is also constructed for remelting using an electron beam 4.

The method shown in FIG. 9 can also be carried out in different sequences. For example, the strip material 3 can first be cut and the crease portions 13 subsequently softened. The hardening is also not necessarily carried out after the cutting, but instead can also be carried out before the cutting. In an advantageous embodiment, crease portions 13 that are softened in the softening step A are hardened again in a subsequent hardening step F in order to ensure sufficient stability and resilient force.

The method steps shown can also be carried out individually with an electron beam 4. For example, an electrical component 1 can be cut using only an electron beam 4 and can be softened and hardened in a different manner. The same applies to softening and hardening. Of course, not all the method steps also have to be carried out during the production of an electrical component. During the production, it is possible, for example, to carry out only one cutting step, but no softening or hardening step.

In another embodiment, an electron beam 4 could also be used to provide structure to a surface of the electrical component. The electron beam 4 could be using partially cut into the surface and thereby score and/or roughen the surface. Lettering using an electron beam 4 is also possible.

Electron beams are advantageously easy and cost-effective to produce and simple to control. The method according to the invention thereby becomes more cost-effective and less complex.

Although exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A method for producing an electrical component, comprising the following steps:
   providing a continuous strip material consisting of a single metal sheet;
   separating a section from the continuous strip material;
   partially hardening a portion of the section using an electron beam; and
   partially softening a separate portion of the section using the electron beam directly on a surface of the section.

2. The method according to claim 1, wherein separating of the portion is performed using the electron beam.

3. The method according to claim 2, further comprising the step of hardening the separate portion.

4. The method according to claim 1, wherein separating the section is performed using another electron beam.

5. The method according to claim 1, wherein the section is a contact element.

6. The method according to claim 1, wherein the continuous strip material includes a carrier.

7. The method according to claim 6, wherein the section is partially separated from the carrier.

8. A method for producing an electrical component, comprising the following steps:
   providing a continuous strip material consisting of a single metal sheet;
   separating a section from the continuous strip material;
   partially softening a portion of the section using an electron beam directly on a surface of the section; and
   partially hardening the portion of the section.

9. The method according to claim 8, wherein separating of the portion is performed using the electron beam.

10. The method according to claim 9, wherein hardening of the portion is performed using the electron beam.

11. The method according to claim 8, wherein separating the section is performed using another electron beam.

12. The method according to claim 11, wherein hardening of the portion is performed using an additional electron beam.

13. The method according to claim 8, wherein the section is a contact element.

14. The method according to claim 8, wherein the continuous strip material includes a carrier.

15. The method according to claim 14, wherein the section is partially separated from the carrier.

16. The method according to claim 1, further comprising the step of bending the section along the softened separate portion.

17. The method according to claim 8, further comprising the step of bending the section along the softened portion prior to partially hardening the portion of the section.

18. The method according to claim 2, wherein the electron beam is used in a vacuum in the separating step.

19. The method according to claim 9, wherein the electron beam is used in a vacuum in the separating step.

* * * * *